United States Patent [19]

Nicholas

[11] 4,394,181
[45] Jul. 19, 1983

[54] METHODS OF MANUFACTURING A SEMICONDUCTOR DEVICE HAVING A CHANNEL REGION SPACED INSIDE CHANNEL STOPPERS

[75] Inventor: Keith H. Nicholas, Reigate, England

[73] Assignee: U.S. Philips Corporation, New York, N.Y.

[21] Appl. No.: 306,041

[22] Filed: Sep. 28, 1981

[30] Foreign Application Priority Data

Oct. 3, 1980 [GB] United Kingdom ................. 8031992

[51] Int. Cl.³ ...................... B01J 17/00; H01L 21/263
[52] U.S. Cl. ...................................... 148/1.5; 29/571; 29/576 B; 148/187; 357/91
[58] Field of Search .................. 148/1.5, 187; 29/571, 29/576 B; 357/91

[56] References Cited

U.S. PATENT DOCUMENTS

| | | | |
|---|---|---|---|
| 4,135,955 | 1/1979 | Gasner et al. ....................... | 148/187 |
| 4,216,573 | 8/1980 | Joshi et al. ............................ | 29/571 |
| 4,235,011 | 11/1980 | Butler et al. .......................... | 29/571 |
| 4,277,882 | 7/1981 | Crossley ................................ | 29/571 |
| 4,294,002 | 10/1981 | Jambotkar et al. ............... | 29/576 B |

Primary Examiner—Upendra Roy
Attorney, Agent, or Firm—Paul R. Miller

[57] ABSTRACT

A method of manufacturing an insulated gate field effect transistor includes the provision of a first masking layer on a semiconductor body followed by the introduction of a dopant characteristic of the conductivity type of the semiconductor body into unmasked areas to form a channel stopper. The unmasked areas are then oxidized to form an inset oxide layer. Subsequently, the masking layer is removed to expose a window in the oxide layer, and then a second masking layer is provided on the oxide layer. The second masking layer includes a second window extending into the first window so that the sides of the second window are situated within the first window. The sides of the second window determine the width of the channel region in a subsequent implantation of ions characteristic of the conductivity type of the channel region. Consequently, the channel region is spaced apart from the channel stoppers, and a very narrow channel region, for example 2 micrometers, is provided.

10 Claims, 4 Drawing Figures

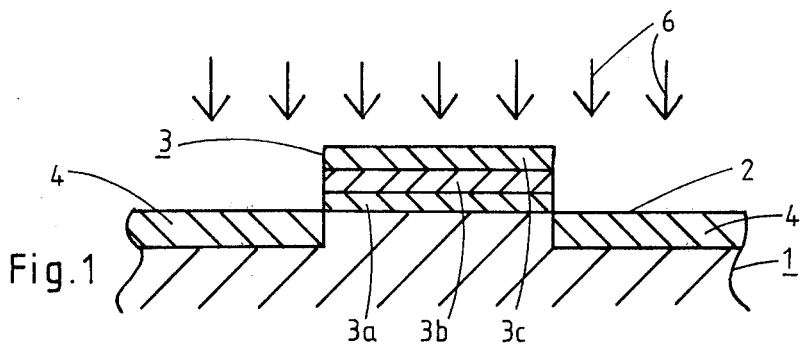
Fig. 1
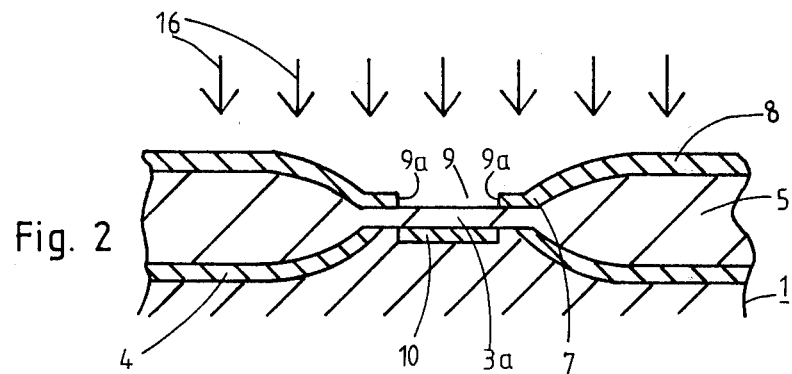
Fig. 2
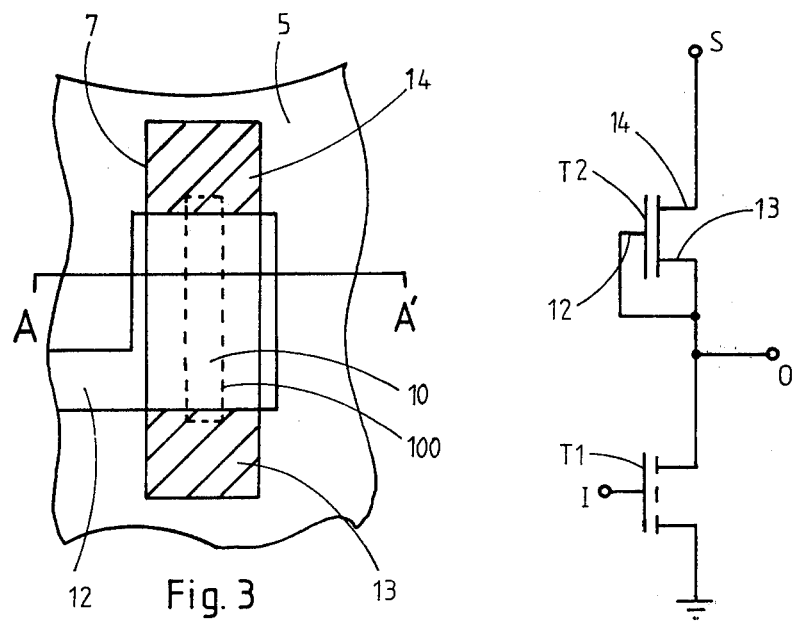
Fig. 3
Fig. 4

METHODS OF MANUFACTURING A SEMICONDUCTOR DEVICE HAVING A CHANNEL REGION SPACED INSIDE CHANNEL STOPPERS

This invention relates to a method of manufacturing a semiconductor device comprising an insulated gate field effect transistor with a channel region along the length of which current can flow during operation of the device. The method includes the steps of providing on a major surface of a semiconductor body portion of the first conductivity type a first masking layer for masking during oxidation and dopant introduction, introducing a dopant into areas of the semiconductor body portion not masked by the first masking layer to form a channel stopper of the first conductivity type, which channel stopper has a higher concentration of dopant than the adjoining parts of the semiconductor body portion, oxidizing areas of the semiconductor body portion not masked by the first masking layer to form an oxide layer which, at least over part of its thickness, is inset in the semiconductor body portion of dopant than the adjoining parts of the semiconductor body portion, with the channel stopper being present below the inset oxide, removing the first masking layer to expose a first window in the inset oxide layer, providing on the inset oxide layer a second masking layer having a second window which masks against ion implantation, and implanting ions characteristic of the second conductivity type through the first and second windows to form the channel region. The invention further relates to a semiconductor device manufactured by this method.

DESCRIPTION OF THE PRIOR ART

One commonly known form of IGFET is the Metal-Oxide Semiconductor-Transistor, generally referred to as the MOST. The current flow along the channel length of a MOST, i.e. between the source and drain regions, is proportional to the width to length (W/L) ratio of the device channel region. Therefore, it is possible to reduce current flow (and consequently power dissipation) by reducing the width and/or increasing the length of the channel region. Generally there is a move towards smaller devices and so, when lower currents are required, it is preferably to decrease the width rather than increase the length of the channel region.

A method of manufacturing a semiconductor device comprising an IGFET is described by Hunter et al. on pages 353 to 359 of I.E.E.E. Transactions on Electron Devices, Vol. ED-26, No. 4, April 1979, in the article entitled: 1 Micron MOSFET VLSI technology: Part V—A single-Level Polysilicon Technology Using Electron-Beam Lithography."In this method ions are implanted into a semiconductor body portion through a first window in an inset or semi-recessed oxide layer to form a channel region of a depletion MOST. In this way the inset oxide acts as a first masking layer so that the sides of the window determine the location of the channel region. During ion implantation an electron sensitive layer is used as a depletion implant blockout mask to mask other exposed areas of the semiconductor body portion where channel regions of enhancement MOSTs have previously been formed.

Because of the way in which the inset oxide layer is formed the edges of this layer at the periphery of the window became progressively thinner towards the window. This phenomenon is known as the bird beak effect and it is problematic because there is a degree of uncertainty regarding where the oxide layer is sufficiently thick to completely mask against the subsequent ion implantation to form the channel regions. To remove this uncertainty the bird beak can be etched back as described under heading C on page 355 of the aforementioned article until, at the edges of the window, the oxide layer is sufficiently thick to completely mask the underlying semiconductor body portion against the ion implantation. However, this results in a substantial overlap of the channel region and the previously formed channel stopper which is present directly below the original inset oxide.

This overlap causes a local increase in the substrate doping at the edges of the channel because the channel stopper is more highly doped than the remainder of the substrate. Unfortunately the magnitude of the substrate doping affects the extent to which the conductivity of the transistor is reduced as the source voltage increases. To compensate for this effect the dopant concentration of the channel can be increased so that if a transistor is required to operate at a particular source voltage the minimum concentration of dopant in the channel region is determined by the requirement for the transistor to conduct sufficiently well at that voltage. However, this has the drawback that at lower voltages there is a substantial increase in conductance because of the high substrate doping and consequently the power dissipation of the transistor at such lower voltage is relatively high.

Another consequence of the overlap mentioned above is that, in order to obtain a well-defined channel region, it is necessary that the dopant concentration of the channel region is greater than that of the channel stopper. The high channel doping results in a high conductance and so high currents can flow along the length of the channel.

The problem of overlap is still present even if the bird beak is not etched back. This is because the edges of the oxide layer are not completely effective in masking against ion implantation and also because there is some lateral diffusion of the channel stopper dopant during the formation of the oxide layer.

Another problem of this method is that the minimum width of the channel region is limited by the presence of the bird beak. There are two reasons for this. First, the formation of the bird beak itself restricts the minimum dimensions of the window in the oxide layer and second, as explained above, the edges of the oxide layer bounding the window are not sufficiently thick to completely mask the semiconductor body portion against the implanted ions. Thus the channel region can only be made wider than the mask used to define the window in the oxide layer. The minimum width of this mask is itself restricted by the limitations imposed by the particular lithographic technique used in its formation.

SUMMARY OF THE INVENTION

According to a first aspect of the present invention a method according to the opening paragraph is characterized in that a second masking layer extends into the first window so that the sides of the second window parallel to the channel length are situated within the first window, with the sides determining the width of the channel region which is spaced apart from the channel stoppers.

Because the channel region is spaced apart from the channel stopper well-defined channel regions can be formed even when the concentration of impurity ions in the channel regions is less than the concentration of dopant in the channel stoppers. Therefore, well-defined channel regions can be formed which have a lower conductance than those of prior art devices.

Furthermore, because the channel stopper and the channel region are spaced apart there is no local increase in the substrate doping at the edges of the channel. The result of this is that, in order to operate at a particular voltage, a transistor in accordance with the invention has a minimum channel doping which is less than that of the prior art transistor described above. In fact, as mentioned previously, the magnitude of the substrate doping affects the extent to which the conductivity of the transistor is reduced as the source voltage increases. Thus a transistor in accordance with the invention has the advantage that at lower voltages there is not such a great increase in conductivity and consequently, at these lower voltages, the power dissipation of such a transistor is less than that of its prior art counterpart.

Also, the invention allows the manufacture of devices comprising IGFETs with narrower channel widths because the bird beaks of the oxide layer are completely covered by the second masking layer. The width of the channel is now determined accurately by the window in the second masking layer. Clearly the channel width is less than the width of the mask used to define the first window in the oxide layer. The amount by which it is less is determined by the extent to which the second masking layer extends into the first window. The width of the second window is limited only by the restrictions imposed by the lithographic technique used for its formation. Because narrower channels can be made using this method it is also possible to reduce the channel length and still obtain an IGFET with a channel region along which the current flow is less than its prior art counterpart. Thus there is the advantage of a saving in the area of the semiconductor body occupied by the device. This area saving means that devices with IGFETs can be made more cheaply or, looked at another way, that more IGFETs can be formed in a given area of a semiconductor body.

To minimize the conductance of the channel region it is preferable that the concentration of impurity ions implanted in the channel region is less than the concentration of dopant in the channel stoppers.

Particularly in the case where the second masking layer is an electron sensitive resist and the second window is defined by electron beam lithography, the width of the second window can be made less than the narrowest window that can be made reproducibly in the inset oxide layer.

Furthermore, because the first window now plays no role in determining the width of the channel region it can be made wider than in the prior art method while still obtaining an IGFET with a narrower channel region. It is particularly advantageous when the width of the first window is more than 4 micrometers, for example 5 micrometers and the width of the second window is less than 4 micrometers, for example 2 micrometers.

According to a further aspect of the invention there is provided a semiconductor device manufactured by a method in accordance with the first aspect of the invention.

BRIEF DESCRIPTION OF THE DRAWINGS

An embodiment of the invention will now be described, by way of example, with reference to the accompanying drawing, in which:

FIGS. 1 and 2 are cross-sectional views of a device at different stages of a method of manufacturing an insulated gate field effect transistor (IGFET) in accordance with the first aspect of the invention, FIG. 3 is a plan view of a device at a subsequent stage in the method, FIGS. 1 and 2 being sections on the line A—A' of FIG. 3, and FIG. 4 is a circuit diagram of an inverter comprising an IGFET in accordance with the second aspect of the invention.

PREFERRED EMBODIMENT

A method in accordance with the invention may be used to manufacture an n-channel depletion MOST as follows. The starting material is a substrate of silicon having a p-type body portion 1 with a resistivity of approximately 3 ohm·cm (see FIG. 1). The major surface 2 of the substrate is parallel to the (100) plane or one of the equivalent planes. A layer of oxide approximately 50 nm thick is grown on the major surface 2 and a layer of silicon nitride having a thickness of approximately 100 nm is deposited on the oxide layer using techniques conventional in the semiconductor art. A photosensitive resist is then deposited on the nitride layer and after exposure to an appropriate radiation pattern a first masking layer 3 is formed in known manner. The masking layer 3 comprises a portion 3a of the oxide layer, a portion 3b of the nitride layer, and a portion 3c of the photoresist layer. The width of the masking layer may be, for example, 5 microns. To form the p-type channel stopper 4 a dopant, in this case boron, is then introduced into the areas of the body portion 1 not masked by the masking layer 3. The dopant is introduced by implanting boron ions using a dose of $2 \times 10^{13}$ cm$^{-2}$ and 25 keV. This ion implantation is represented by the arrows 6 in FIG. 1.

After removal of the resist portion 3c the next step in the method is to oxidize in known manner the areas of semiconductor body portion 1 not masked by the masking layer 3. An oxide layer 5, which, at least over part of its thickness, is inset in the body portion 1, is grown to a thickness of approximately 0.8 micrometer (see FIG. 2). The portion 3b of the nitride layer is then removed in known manner to expose a first window 7 in the oxide layer 5.

An electron sensitive resist layer is then deposited on the oxide layer 5 and on the areas of the semiconductor body portion 1 exposed by the window 7. This resist layer is exposed to an electron beam after which it is developed to form a second masking layer 8 comprising a second window 9 which may be, for example, 2 micrometers wide. The masking layer 8 extends into the window 7 so that the sides 9a of the window 9 are situated within the window 7.

The next step is to implant arsenic ions into the exposed area of the semiconductor body portion 1 through the window 9 to form the n-type channel region 10. In FIG. 2 the implant of arsenic ions is represented by the arrows 16. The dose is, for example, $1.5 \times 10^{12}$ cm$^{-2}$ and 170 keV. The sides 9a of the window 9 determine the width of the channel region 10 and in this example this width is approximately 2 micrometers. As the channel width is less than the width of the window 7 the channel region 10 is spaced apart from the channel stoppers 4.

After removal of the resist layer 8 a polysilicon layer approximately 0.6 micrometer thick is deposited on the semiconductor body portion 1 in the window 7 and on the oxide layer 5. In known manner phosphorus is diffused into the polysilicon layer. Subsequently the polysilicon layer is oxidized and a mask is formed from the resulting oxide. This mask is used to define the gate electrode 12 in known manner (see FIG. 3).

Phosphorus ions are then implanted into the semiconductor body using a dose of $2 \times 10^{15}$ cm$^{-2}$ and 100 keV. The gate 12 and the inset oxide layer 5 mask against the implanted ions. Thus at the exposed areas, i.e. the cross-hatched areas in FIG. 3, of the body portion 1 n-type source and drain regions 13 and 14 respectively are formed. At this stage the length of the channel region which may be, for example 12 micrometers is determined by the gate electrode 12.

The MOST is completed using techniques well-known to those skilled in the semiconductor art by depositing an insulating layer, forming contact windows therein and then defining the metallization to contact the gate and the source and drain regions. These steps are described for example, in the aforementioned article by Hunter et al. and so further details will not be given here.

At the stage of the method shown in FIG. 3 the masking layer 8 (see FIG. 2) has been removed. However, because the sides 9a of the window 9 in the masking layer 8 define the lateral extent of the channel region 10 the boundary line 100 (see FIG. 3) of the channel region 10 indicates where the sides 9a of the window 9 were present before the masking layer 8 was removed. In the example described the window 9 was situated entirely within the window 7 in the oxide layer 5. However, in order that the channel region 10 and the channel stopper 4 are spaced apart it is only necessary that the sides of the window 9 parallel to the channel length are situated within the window 7. This is because the channel length is determined by the gate electrode 12 and not by the window 7. Any overlap of the channel stoppers and the implanted ions forming the channel region at the area where the source and drain region are to be formed is unimportant because these areas will be overdoped by the source and drain regions of the transistor. As these regions have a greater impurity concentration than the adjoining channel stoppers their boundaries are well-defined in spite of the overlap.

In the method described above the first masking layer comprises three portions, namely the oxide portion 3a, the nitride portion 3b and the resist portion 3c. The oxide portion 3a in fact constitutes the gate oxide of the MOST. However, it is not necessary that the gate oxide is formed at this early stage as will be apparent to those skilled in the art. Therefore, the masking layer need not comprise three portions. In fact it may comprise only a single portion, in this case the nitride portion, the resist portion having been removed before the channel stopper implant.

So far the method described has been in terms of manufacturing a single n-channel depletion MOST. Nevertheless a method in accordance with the invention may be used to manufacture a p-channel MOST. In this case the conductivity type of the semiconductor body portion, the source and drain regions, the channel region, and the channel stoppers is opposite to that mentioned in the method described above.

Of course other circuit elements can be manufactured at the same time on the same semiconductor substrate as an insulated gate field effect transistor in accordance with the second aspect of the invention. For example, in the simultaneous manufacture of an n-channel depletion MOST and an n-channel enhancement MOST the inset oxide layer pattern comprises two windows. One of these can be masked by a radiation sensitive resist during the channel implant to form the depletion MOST and the other is masked during the channel implant to form the enhancement MOST.

In an alternative method of manufacturing simultaneously a depletion and an enhancement MOST, the inset oxide may comprise only a single window. In this case during the channel implant to form the depletion MOST, a first part of this single window is masked by a radiation sensitive resist while the remainder of the window is exposed. Subsequently the remainder of the window is masked while the first part is exposed during the channel implant to form the enhancement MOST.

FIG. 4 shows a circuit diagram of an inverter comprising an enhancement MOST T1 and a depletion MOST T2 manufactured by a method in accordance with the invention. T2 is the load MOST and T1 is the switching MOST. A supply voltage $V_s$ is applied to the supply terminal S, which is connected to the drain of T2. The source of T2 is connected to the drain of T1 and the source of T1 is connected to ground. An input terminal I is connected to the gate of T1 and an output terminal O is connected to the source and drain of T2 and T1 respectively. The gate of T2 is permanently connected to its source. In this way the n-channel enhancement transistors formed in parallel on each side of the n-channel depletion MOST (see FIG. 3) never switch on so that T2 functions only as a depletion MOST. When the voltage applied to input I is 0V T1 is switched off so that the voltage at the output O is $V_s$ and when the voltage applied to input is $V_s$ T2 is switched on so that the voltage at the output O is 0V.

Thus the minimum dopant concentration of the channel region of T2 is determined by the requirement that when T1 is off, i.e. when the source of T2 is at a high voltage, T2 must be capable of conducting. However, when T1 is switched on, the source voltage of T2 is lowered and the power dissipation of the circuit is determined by the conductance of T2. Because the channel region and the channel stopper of T2 are spaced apart the substrate doping is not increased locally at the edge of the channel region as it is in the prior art transistor described above. Consequently, when T1 is on, the power dissipation of this circuit is less than it would be in an equivalent circuit comprising such a prior art depletion MOST as a load.

Thus it is particularly advantageous to use an inverter comprising an n-channel depletion MOST load manufactured by a method in accordance with the invention. Also, as explained above, the enhancement MOST can be manufactured at the same time on the same semiconductor substrate.

What is claimed is:

1. A method of manufacturing a semiconductor device with an insulated gate field effect transistor having a channel region comprising the steps of
providing a first masking layer on a major surface of a semiconductor body of one conductivity type,
introducing a dopant into unmasked areas of said semiconductor body through said first masking layer to form channel stoppers of said one conductivity type, said channel stoppers having a higher concentration of said dopant than adjoining portions of said semiconductor body, oxidizing said unmasked areas of said semiconductor body to form an oxide layer inset on said semiconductor body, said channel stoppers being present below said inset oxide layer, removing said first masking layer to expose a first window bounded by said inset oxide layer, providing a second masking layer on said inset oxide layer and inside said first window for masking against ion implantation, said second masking layer providing a second window having sides parallel to the channel length situated within said first window, said sides determining the width of the channel region to be spaced apart from said channel stoppers, and implanting ions characteristic of a second conductivity type through said second window to form said channel region.

2. A method according to claim 1, wherein said second masking layer is an electron sensitive resist, and wherein said second window is defined by electron beam lithography.

3. A method according to claim 1, wherein said ions implanted through said first and second windows are n-conductivity type, and wherein the insulated gate field effect transistor is an n-channel depletion MOST.

4. A method according to claim 1, wherein said first window has said width greater than 4 micrometers and said second window has said width less than 4 micrometers.

5. A method according to claim 1, wherein said first window has said width of approximately 5 micrometers and said second window has said width of approximately 2 micrometers.

6. A method according to claim 1, wherein said second window is situated entirely within said first window.

7. A method according to claim 1, wherein said channel region has a concentration of implanted ions less than said concentration of dopant in said channel stoppers.

8. A method according to claim 2, wherein said first window has said width greater than 4 micrometers and said second window has said width less than 4 micrometers.

9. A method according to claim 8, wherein said first window has said width of approximately 5 micrometers and said second window has said width of approximately 2 micrometers.

10. A method according to claim 9, wherein said second window is situated entirely within said first window.

* * * * *